US012750053B2

(12) United States Patent
Bhattacharya et al.

(10) Patent No.: US 12,750,053 B2
(45) Date of Patent: Sep. 29, 2026

(54) ANALOG SWITCH

(71) Applicant: TEXAS INSTRUMENTS INCORPORATED, Dallas, TX (US)

(72) Inventors: Upasana Bhattacharya, Bangalore (IN); Shishir Goyal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/680,078

(22) Filed: May 31, 2024

(65) Prior Publication Data

US 2025/0373247 A1 Dec. 4, 2025

(51) Int. Cl.
*H03K 17/687* (2006.01)
*H03K 19/0175* (2006.01)

(52) U.S. Cl.
CPC . *H03K 17/6872* (2013.01); *H03K 19/017509* (2013.01)

(58) Field of Classification Search
CPC ..................... H03K 19/01709; H03K 17/6872
See application file for complete search history.

(56) References Cited

U.S. PATENT DOCUMENTS 4,985,703 A * 1/1991 Kaneyama ........... H03K 17/693 327/408
5,023,688 A * 6/1991 Ando ..................... H10D 84/85 257/350
5,065,057 A * 11/1991 Kawasaki ............ H03K 17/693 327/437
5,617,055 A * 4/1997 Confalonieri ...... H03K 17/6872 327/403
6,097,067 A * 8/2000 Ouchi .................... H10D 84/85 257/369
6,335,653 B1 * 1/2002 Shigehara ............ H03K 17/063 327/404
7,982,521 B2 * 7/2011 Zmora ................. H03K 17/102 327/310
9,520,880 B2 * 12/2016 Eversmann ...... H03K 19/09407
2017/0206941 A1 * 7/2017 Po .......................... G11C 16/30
2020/0287533 A1 * 9/2020 Kawai .............. H03K 17/04206
2022/0342436 A1 * 10/2022 Yuh ........................... G05F 3/24

FOREIGN PATENT DOCUMENTS

CN 119210356 A * 12/2024 ......... H03F 3/45071

* cited by examiner

*Primary Examiner* — Menatoallah Youssef
*Assistant Examiner* — Khareem E Almo
(74) *Attorney, Agent, or Firm* — Xianghui Huang; Frank D. Cimino

(57) ABSTRACT

A circuit includes first and second n-type transistors, and first and second p-type transistors. A first terminal of the second n-type transistor is coupled to a second terminal of the first n-type transistor. Control terminals of the first and second n-type transistors are coupled. A first terminal of the first p-type transistor is coupled to a first terminal of the first n-type transistor. A first terminal of the second p-type transistor is coupled to a second terminal of the first p-type transistor. A second terminal of the second p-type transistor is coupled to a second terminal of the second n-type transistor. Control terminals of the first and second p-type transistors are coupled. A control circuit has a first output coupled to the control terminals of the first and second n-type transistors, and a second output coupled to the control terminals of the first and second p-type transistors.

19 Claims, 8 Drawing Sheets

ANALOG SWITCH

BACKGROUND

Transistors such as metal insulator semiconductor field effect transistors (MISFET) or metal oxide semiconductor field effect transistors (MOSFET) require a specific gate voltage in order to turn on. Generally, this gate voltage is supplied by a gate driver. Thus, the gate driver turns the transistor on and off.

SUMMARY

This invention relates to a circuit comprising a first n-type transistor, a second n-type transistor, a first p-type transistor, a second p-type transistor, and a control circuit. The first n-type transistor has a first terminal, a second terminal, and a control terminal. The first n-type transistor has a first threshold voltage. The second n-type transistor has a first terminal, a second terminal, and a control terminal. The first terminal of the second n-type transistor is coupled to the second terminal of the first n-type transistor. The control terminal of the second n-type transistor is coupled to the control terminal of the first n-type transistor. The second n-type transistor has the first threshold voltage. The first p-type transistor has a first terminal, a second terminal, and control terminal. The first terminal of the first p-type transistor is coupled to the first terminal of the first n-type transistor. The first p-type transistor has a second threshold voltage. The second p-type transistor has a first terminal, a second terminal, and a control terminal. The first terminal of the second p-type transistor is coupled to the second terminal of the first p-type transistor. The second terminal of the second p-type transistor is coupled to the second terminal of the second n-type transistor. The control terminal of the second p-type transistor is coupled to the control terminal of the first p-type transistor. The second p-type transistor has the second threshold voltage. The control circuit is coupled between a first voltage supply terminal and a second voltage supply terminal. The control circuit has a first output and a second output. The first output of the control circuit is coupled to the control terminal of the first n-type transistor and coupled to the control terminal of the second n-type transistor. The second output of the control circuit is coupled to the control terminal of the first p-type transistor and coupled to the control terminal of the second p-type transistor.

In another embodiment, this invention relates to an integrated circuit comprising a first n-type metal oxide semiconductor field effect transistor (n-MOSFET), a second n-MOSFET, a first p-type metal oxide semiconductor field effect transistor (p-MOSFET), a second p-MOSFET, a first gate driver, a second gate driver, and a level shifter. The first n-MOSFET has a first terminal, a second terminal, and a control terminal. The second n-MOSFET has a first terminal, a second terminal, and a control terminal. The first terminal of the second n-MOSFET is coupled to the second terminal of the first n-MOSFET. The control terminal of the second n-MOSFET is coupled to the control terminal of the first n-MOSFET. The first p-MOSFET has a first terminal, a second terminal, and a control terminal. The first terminal of the first p-MOSFET is coupled to the first terminal of the first n-MOSFET. The second p-MOSFET has a first terminal a second terminal and a control terminal. The first terminal of the second p-MOSFET is coupled to the second terminal of the first p-MOSFET. The second terminal of the second p-MOSFET is coupled to the second terminal of the second n-MOSFET, and the control terminal of the second p-MOSFET is coupled to the control terminal of the first p-MOSFET. The first gate driver has an input and an output. The output of the first gate driver is coupled to the control terminal of the first n-MOSFET and the control terminal of the second n-MOSFET. The second gate driver has an input and an output. The output of the second gate driver is couped to the control terminal of the first p-MOSFET and the control terminal of the second p-MOSFET. The level shifter has a control terminal, a first output terminal, and a second output terminal. The first output terminal of the level shifter is coupled to the input of the first gate driver, and the second output terminal of the level shifter is coupled to the input of the second gate driver.

Furthermore, in another example, this invention relates to an integrated circuit having a first input terminal, a second input terminal, and an output terminal. The integrated circuit comprises a first resistor, a first diode-connected transistor, a second diode-connected transistor, a third diode-connected transistor, a fourth diode-connected transistor, a second resistor, a reference voltage generator, and a selector circuit. The first resistor has a first terminal and a second terminal. The first terminal of the first resistor is connected to the first input terminal. The first diode-connected transistor has a first terminal and a second terminal. The first terminal of the first diode-connected transistor is connected to the second terminal of the first resistor. The second diode-connected transistor has a first terminal and a second terminal. The first terminal of the second diode-connected transistor is connected to the second terminal of the first diode-connected transistor. The third diode-connected transistor has a first terminal and a second terminal. The first terminal of the third diode-connected transistor is connected to the second terminal of the second diode-connected transistor. The fourth diode-connected transistor has a first terminal and a second terminal. The first terminal of the fourth diode-connected transistor is connected to the second terminal of the third diode-connected transistor. The second resistor has a first terminal and ad second terminal. The first terminal of the second resistor is connected to the second terminal of the fourth diode-connected transistor. The second terminal of the second resistor is connected to the second input terminal. The reference voltage generator has a first terminal, a second terminal, and a third terminal. The first terminal of the reference voltage generator is connected to the first input terminal. The second terminal of the reference voltage generator is connected to the second input terminal. The selector circuit has a first terminal, a second terminal, and a third terminal. The first terminal of the selector circuit is connected to the second terminal of the first resistor. The second terminal of the selector circuit is connected to the third terminal of the reference voltage generator. The third terminal of the selector circuit is connected to the output terminal.

DETAILED DESCRIPTION

A gate driver provides a turn-on voltage sufficient to turn a transistor on during a first time, and provides a turn-off voltage sufficient to turn the transistor off during a second time. The gate driver provides these on and off voltages to fall within a predetermined voltage range. If the gate driver provides a voltage that is outside of the predetermined voltage range, the transistor may be damaged. For some circuits, fulfilling all of these requirements can lead to a complicated circuit, utilizing a large amount of wafer area.

Some example circuits of the present disclosure relate to a bi-directional switch including a control circuit and a transmission gate. The transmission gate includes n-type transistors and p-type transistors. The control circuit provides gate voltages to the n-type and p-type transistors in response to a control signal received on a control terminal of the switch. When the control signal is in an on state (e.g., 5 Volts (V)), the control circuit "closes" the transmission gate. The control circuit "closes" the transmission gate by providing a first n-type gate voltage (e.g., 6 V for a supply voltage of 10 V) to gates of the n-type transistors and concurrently providing a first p-type gate voltage (e.g., 4 V for a supply voltage of 10 v) to the gates of the p-type transistors. This forms a conductive path through the n-type and p-type transistors and couples a first switch terminal of the switch to a second switch terminal of the switch. In contrast, when the control signal is in an off state (e.g., 0 V), the control circuit "opens" the transmission gate. The control circuit opens the transmission gate by providing a second n-type gate voltage (e.g., 0 V) to the gates of the n-type transistors and providing a second p-type gate voltage (e.g., 10 V) to the gates of the p-type transistors. This electrically isolates the first switch terminal of the switch from the second switch terminal of the switch. Because gate voltages are used to drive the gates of the n-type and p-type transistors, the control circuit is able to provide the gate voltages quickly and accurately to "open" and "close" the transmission gate. Moreover, the gate voltages are only slightly greater than the minimal magnitude of gate voltages that cause the n-type and p-type transistors to conduct. This helps limit the use of high overdrive voltages for the n-type and p-type transistors, which extends the lifetime of the switch compared to if high overdrive voltages were used. Also, the switch is implemented as a simple circuit that utilizes a small amount of wafer area.

Figure 1:
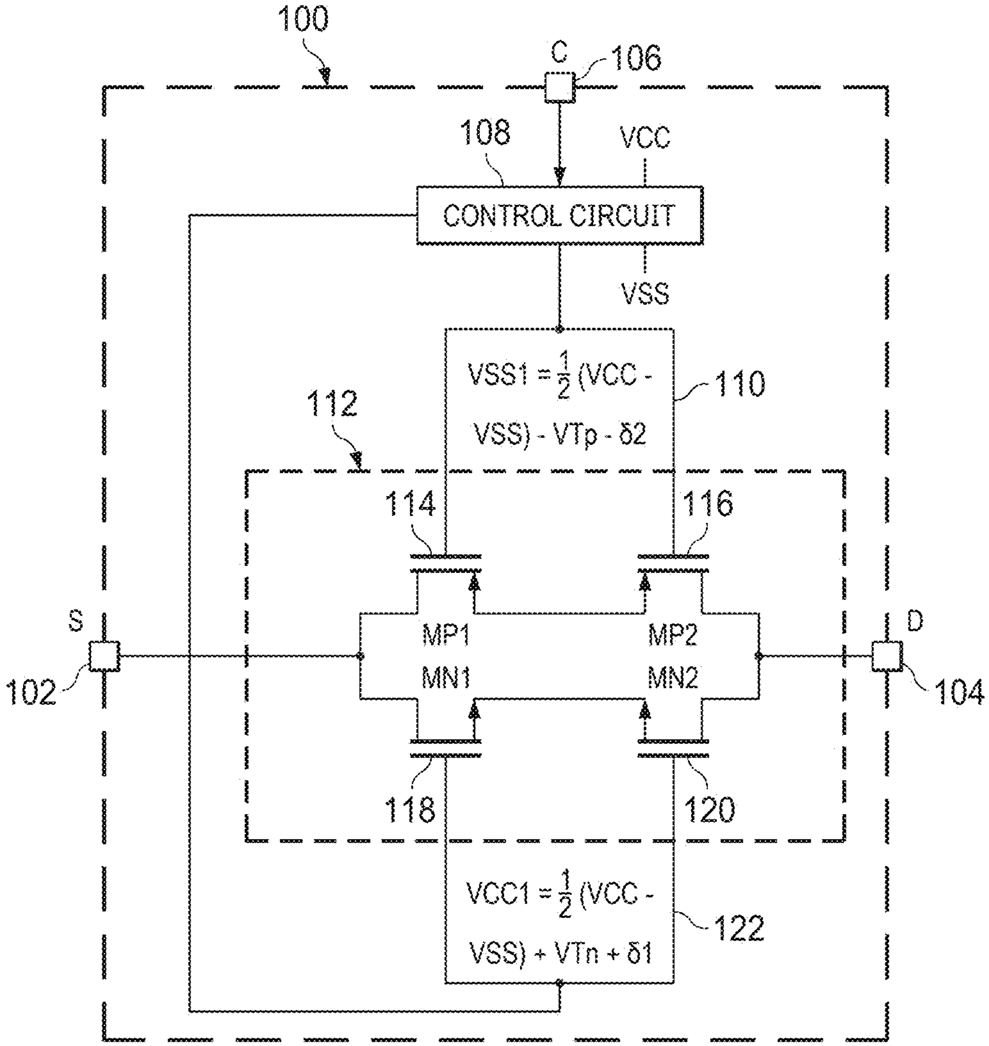
FIG. 1 shows an example drawing of an analog switch including a control circuit.

FIG. 1 shows a circuit 100 that corresponds to a switch. The circuit 100 has a first switch terminal 102, a second switch terminal 104, and a control terminal 106. The circuit 100 includes a control circuit 108 and a transmission gate 112. The transmission gate 112 includes a first p-type transistor 114 (MP1), a second p-type transistor 116 (MP2), a first n-type transistor 118 (MN1), and a second n-type transistor 120 (MN2).

The control terminal 106 is connected to an input of the control circuit 108. The control circuit 108 is connected to a first voltage supply terminal VCC and a second voltage supply terminal VSS. The control circuit 108 has a first output 122 and a second output 110. The first output 122 is connected to a control terminal of the first n-type transistor 118 and a control terminal of the second n-type transistor 120. The second output 110 is connected to a control terminal of the first p-type transistor 114 and a control terminal of the second p-type transistor 116.

The first p-type transistor 114 has a first terminal connected to the first switch terminal 102, and a second terminal connected to a first terminal of the second p-type transistor 116. The second p-type transistor 116 has a second terminal connected to the second switch terminal 104. The first n-type transistor 118 has a first terminal connected to the first switch terminal 102, and a second terminal connected to a first terminal of the second n-type transistor 120. The second n-type transistor 120 has a second terminal connected to the second switch terminal 104. The first p-type transistor 114 has a control terminal directly connected to a control terminal of the second p-type transistor 116. The first n-type transistor 118 has a control terminal directly connected to a control terminal of the second n-type transistor 120. The first p-type transistor 114 and the second p-type transistor 116 have a first voltage threshold, VTp. The first n-type transistor 118 and the second n-type transistor 120 have a second voltage threshold, VTn. Although the transistors 114, 116, 118, and 120 are each illustrated as a MOSFET, other types of transistors, such as junction FETs (JFETs), bipolar junction transistors (BJTs), MISFETS, and/or other suitable transistor technology can also be used.

During operation, the control circuit 108 receives a control signal from control terminal 106. The control signal controls whether the transistors of the transmission gate 112 are ON or OFF. When the transistors of the transmission gate 112 are ON, the switch is "closed", which means a conductive path exists between the first switch terminal 102 and the second switch terminal 104. In contrast, when the transistors of the transmission gate 112 are OFF, the switch is "open", which means there is no conductive path between the first switch terminal 102 and the second switch terminal 104. Thus, when, for example, a first voltage (e.g., off-state=0 V) is applied to the control terminal 106, the control circuit 108 provides a first p-type transistor gate voltage (e.g., 10 V) to gates of the p-type transistors 114, 116 to turn off p-type transistors 114, 116, and concurrently provides a first n-type gate voltage (e.g., 0V) to gates of the n-type transistors 118, 120 to turn off n-type transistors 118, 120. In contrast, when a second voltage (e.g., on-state=5 V), for example, is applied to the control terminal 106, the control circuit 108 provides a second p-type transistor gate voltage (e.g., VSS1=4 V when VCC=10 V) that turns on p-type transistors 114, 116, and a second n-type gate voltage (e.g., VCC1=6 V when VCC=10 V) that turns on n-type transistors 118, 120. Thus, the switch "opens" and "closes" a conductive path between first terminal 102 and second terminal 104 in response to changes in the control signal on control terminal 106.

More particularly, when the control signal on the control terminal 106 is in an on state (e.g., 5 V), the control circuit 108 provides the second n-type transistor gate voltage (which may also be referred to in some examples as a first output voltage VCC1) to the n-type transistors 118, 120. The control circuit 108 also provides the second p-type transistor gate voltage (which may also be referred to in some examples as a second output voltage VSS1) to the p-type transistors 114, 116. The first output voltage, VCC1, is greater than (VCC−VSS)/2+VTn, where VTn is the voltage threshold of both the first n-type transistor 118 and the second n-type transistor 120. For example, if VCC=10 V, VSS=0 V, and VTn=1 V, then VCC1 can be 6 V. The second output voltage, VSS1, is less than (VCC−VSS)/2-VTp, where VTp is the voltage threshold of both the first p-type transistor 114 and the second p-type transistor 116. For example, if VCC=10 V, VSS=0 V, and VTp=1 V, then VSS1 can be 4V. Alternatively, VCC1 can be equal to (VCC−VSS)/2+VTn+δ1, where δ1 is a first additional voltage margin that is inserted to account for non-ideal characteristics (e.g., manufacturing variation) of the first and second n-type transistors 118, 120. Similarly, in an alternative example, VSS1 can be equal to (VCC−VSS)/2−VTp−δ2, where δ2 is a second additional voltage margin that is inserted to account for non-ideal characteristics (e.g., manufacturing variation) of the first and second p-type transistors 114, 116. In some examples, the first additional voltage offset, δ1, can be within two percent, ten percent, twenty percent, or fifty percent of (VCC−VSS)/2+VTn; and the second additional voltage offset, δ2, can be within two percent, ten percent, twenty percent, or fifty percent of (VCC−VSS)/2−VTp.

The circuit 100 allows current to be conducted bi-directionally from the first switch terminal 102 to the second switch terminal 104. More particularly, the first n-type transistor 118 and the second n-type transistor 120 conduct from the first switch terminal 102 to the second switch terminal 104 for low source/drain voltages. The first p-type transistor 114 and the second p-type transistor 116 conduct from the first switch terminal 102 to the second switch terminal 104 for high source/drain voltages. There are also some intermediate source/drain voltages where each of the p-type transistors 114, 116 and n-type transistors 118, 120 conduct from the first switch terminal 102 to the second switch terminal 104.

Because the first p-type transistor 114 and the second p-type transistor 116 conduct bi-directionally at high source/drain voltages and the first n-type transistor 118 and the second n-type transistor 120 conduct bi-directionally at low source/drain voltage, the combination of all the transistors forms a bi-directional conductive path that is operable over a wide source/drain range. Moreover, because the control circuit 108 turns on the p-type transistors using a gate voltage on the second output 110 that is only slightly greater than the VTp of the p-type transistors, this tends to extend the lifetime of the p-type transistors 114, 116 compared to if high overdrive voltages were used. Similarly, because the control circuit 108 turns on the n-type transistors using a gate voltage on the first output 122 that is only slightly greater than the VTn of the n-type transistors, this tends to extend the lifetime of the n-type transistors 118, 120 compared to if high overdrive voltages were used. Thus, the switch of FIG. 1 can provide reliable operation over a long time period, and can be implemented as a simple circuit that utilizes a small amount of wafer area.

In some examples, the circuit 100 is an integrated circuit, and the control circuit 108 and the transistors 114, 116, 118, 120 can be arranged on a single semiconductor die (e.g., on a single monocrystalline silicon substrate), or can be on separate integrated circuit die stacked over one another and/or adjacent to one another in a packaged integrated circuit, such as a so-called three-dimensional integrated circuit package. When the circuit is a single integrated circuit, first switch terminal 102, second switch terminal 104, and control terminal 106 can be pins of the integrated circuit. In other examples, however, the control circuit 108 and the transistors 114, 116, 118, 120 can be discrete components arranged on a printed circuit board (PCB) or other package, and can be operably coupled by conductive traces on the PCB. Further, while a "pin" can be interpreted as an external node of an integrated circuit, connection points illustrated and described as "pins" herein can also be internal nodes of a packaged integrated circuit and/or die in other examples.

Figure 2:
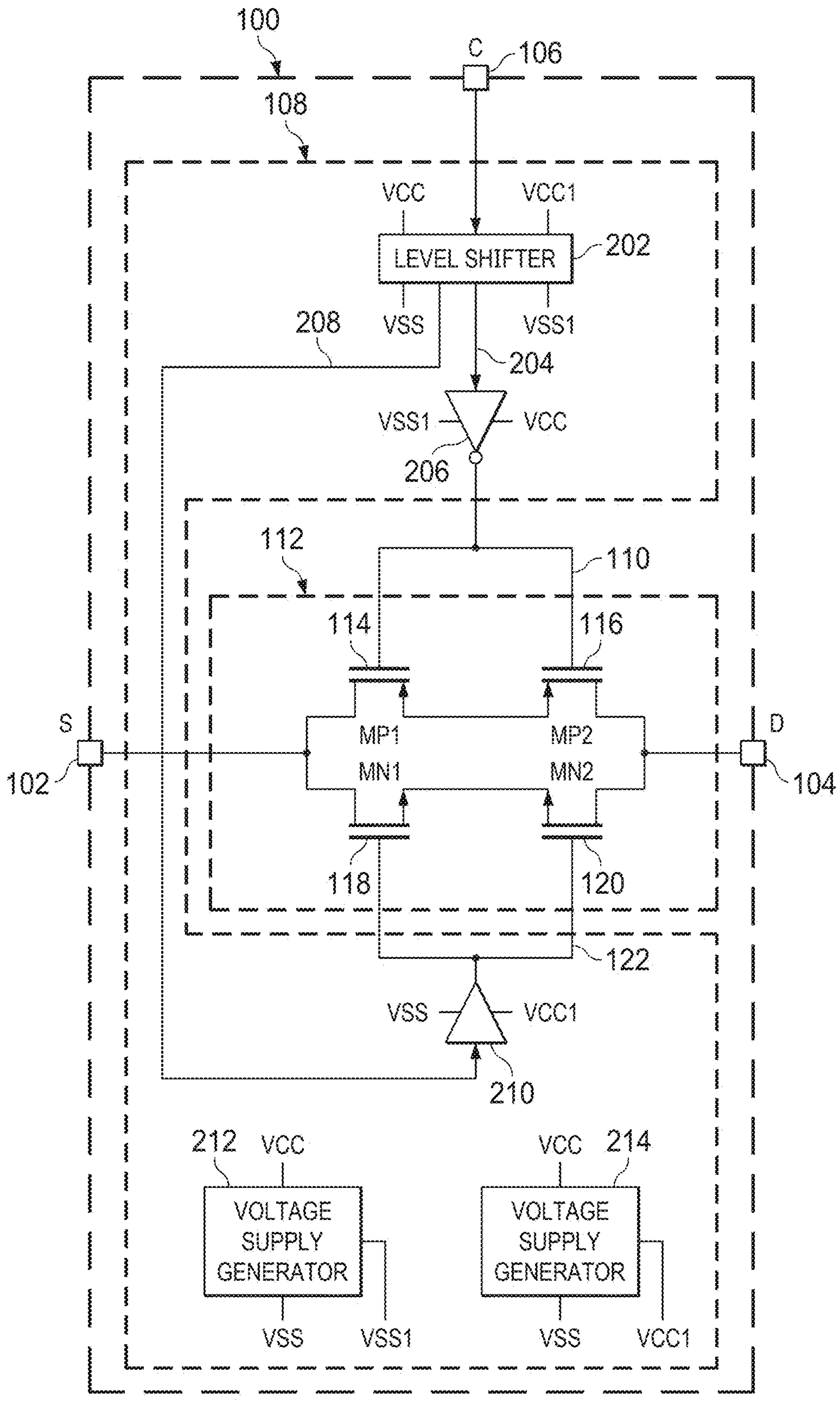
FIG. 2 shows an example of a control circuit used with an analog switch including a gate driver.

FIG. 2 shows the circuit 100 with more details of an implementation of the control circuit 108. In this example, the control circuit 108 includes a level shifter 202, an inverter 206, a buffer 210, a first voltage supply generator 212, and a second voltage supply generator 214. The inverter 206 and the buffer 210 may also be referred to as gate driver circuits. The inverting capability of the inverter 206 may be performed by the level shifter 202 such that the inverter 206 may be replaced by a second buffer and still provide the same functionality. In that sense, the buffer 210 and the inverter 206 both provide a low impedance input to the transistors to aid in switching speeds of the transistors.

The level shifter 202 has a control terminal connected to the control terminal 106, a first voltage supply terminal connected to VCC, a second voltage supply terminal connected to VSS, a first input terminal connected to an output terminal of the first voltage supply generator 212, a second input terminal connected to an output terminal of the second voltage supply generator 214, a first output 208 connected to the buffer 210, and a second output 204 connected to the inverter 206. The inverter 206 has a first voltage supply terminal connected to the output of the first voltage supply generator 212, a second voltage supply terminal connected to VCC, and an output connected to the control terminals of the first p-type transistor 114 and the second p-type transistor 116.

The buffer 210 has a first voltage supply terminal connected to VSS, a second voltage supply terminal connected to the output of the second voltage supply generator 214, and an output connected to the control terminals of the first n-type transistor 118 and the second n-type transistor 120.

The first voltage supply generator 212 has a first voltage supply terminal connected to VCC, a second voltage supply terminal connected to VSS, and an output connected as stated above. The second voltage supply generator 214 has a first voltage supply terminal connected to VCC, a second voltage supply terminal connected to VSS, and an output connected as stated above.

The first voltage supply generator 212 provides the voltage VSS1, and the second voltage supply generator 214 provides the voltage VCC1. The voltages VSS1 and VCC1 are such that they allow the first p-type transistor 114, the second p-type transistor 116, the first n-type transistor 118, and the second n-type transistor 120 to function as a bi-directional switch as described in the description for FIG. 1. The level shifter 202 receives a control signal from the control terminal 106. The control signal may have a high value and a low value within a range. The range may be VSS−VCC which may be between −50V to 50V, for example, 0V to 5V, or 0V to 10V, or any other suitable range. The level shifter 202 then shifts this range to be between VSS and VCC1 on the first output 208, and between VSS1 and VCC on the second output 204. The buffer 210 buffers the voltage to either turn the first n-type transistor 118 and the second n-type transistor 120 on or off. The inverter 206 inverts the value, then provides the voltage to the first p-type transistor 114 to turn on or off.

Figure 3:
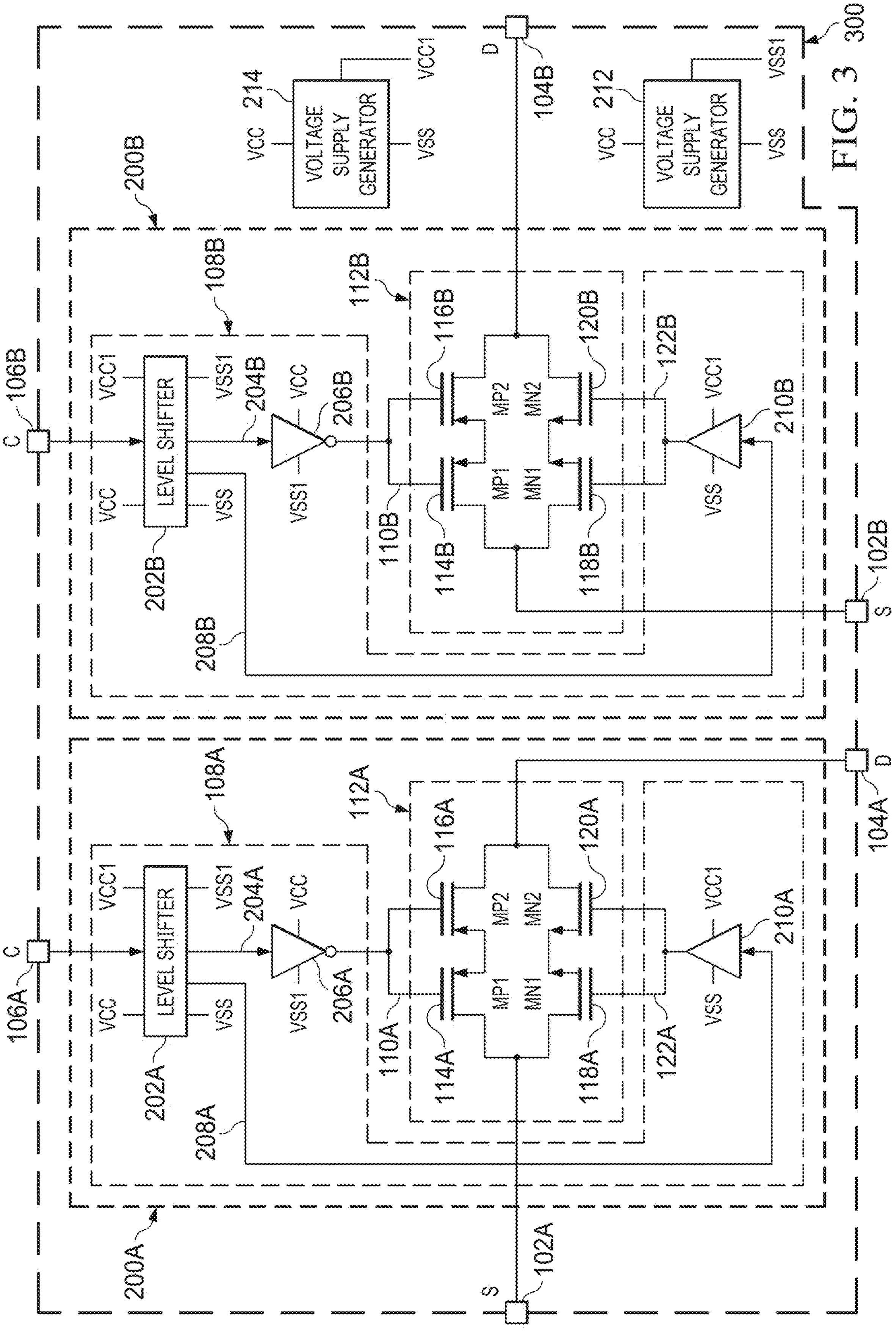
FIG. 3 shows an example of multiple switches sharing connections to voltage generators.

FIG. 3 shows an example of a circuit 300 having multiple switches 200*a*-200*b*. In this example, the first switch 200*a* and the second switch 200*b* share the same connections with a first voltage supply generator 212 and a second voltage supply generator 214. By sharing the first voltage supply generator 212 and the second voltage supply generator 214, less resources are used to implement the analog switch including a gate driver. It has been appreciated that although only two switches 200*a*-200*b* are shown, that there may be more than two such as for example 1,000 or more switches or 3 or more switches configured to be connected to the first voltage supply generator 212 and the second voltage supply generator 214.

The circuit 300 can be an integrated circuit where the control circuits 108*a*, 108*b*, transmission gates 112*a*, 112*b*, and voltage supply generators 212, 214 can be arranged on a single semiconductor die (e.g., on a single monocrystalline silicon substrate). In other examples, the control circuits 108*a*, 108*b*, transmission gates 112*a*, 112*b*, and voltage supply generators 212, 214 can be on separate integrated circuit die stacked over one another and/or adjacent to one another in a packaged integrated circuit, such as a so-called three-dimensional integrated circuit package. In other examples, however, the control circuits 108*a*, 108*b*, transmission gates 112*a*, 112*b*, and voltage supply generators 212, 214 can be discrete components arranged on a printed circuit board (PCB) or other package, and can be operably coupled by conductive traces on the PCB.

Figure 4:
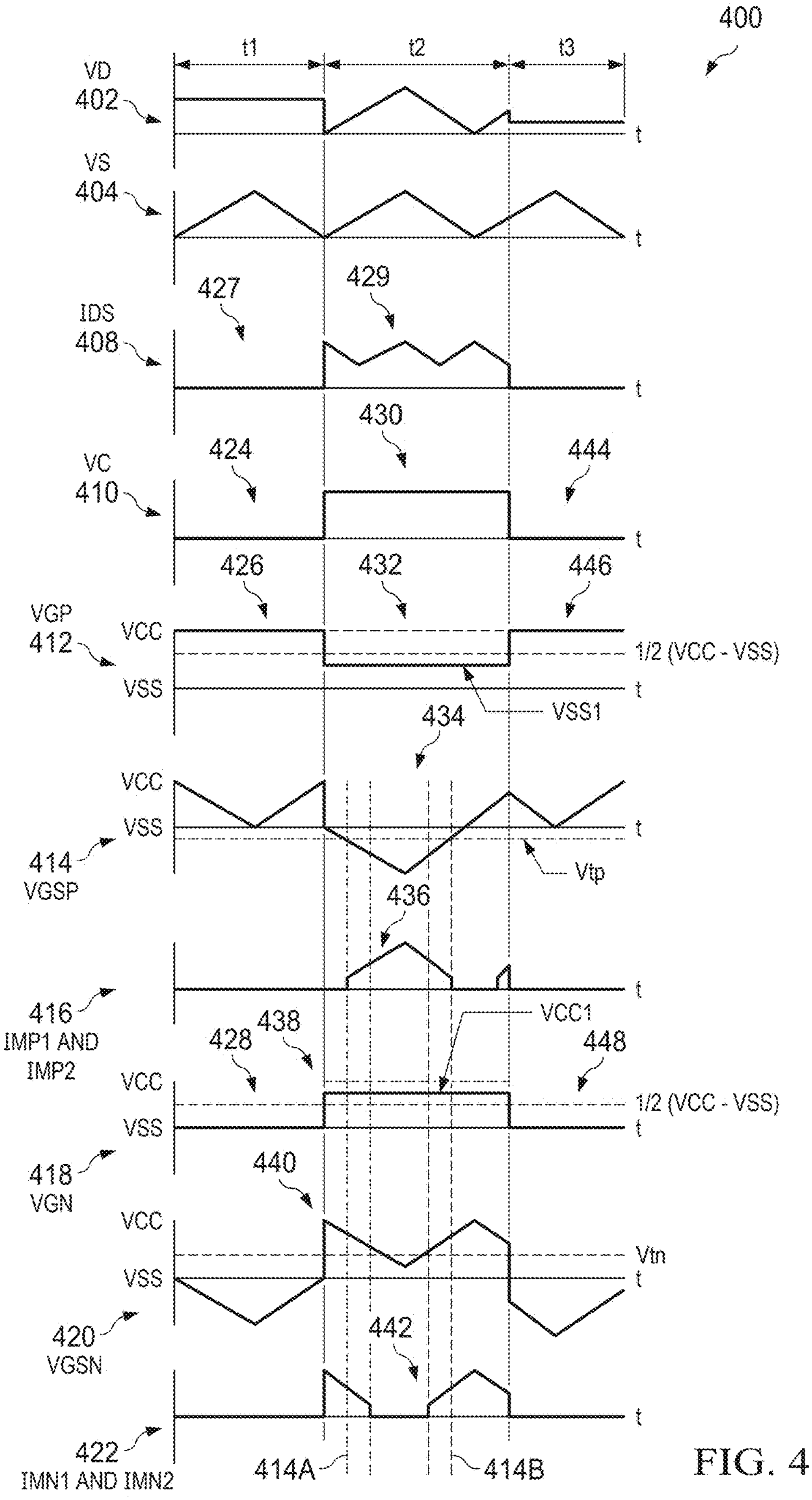
FIG. 4 shows waveforms of the voltage and current characteristics of an example of a switch.

FIG. 4 shows waveforms 400 that displays the operating characteristics of the circuit 100. Graph 402 shows the voltage at the second switch terminal 104 varying through time. Graph 404 shows the voltage at the first switch terminal 102 varying through time. Graph 408 shows the current between the first switch terminal 102 and the second switch terminal 104. Graph 410 shows the voltage at the control terminal 106 varying through time. Graph 412 shows the gate voltage of the first p-type transistor 114 and the second p-type transistor 116 varying through time. Graph 414 shows the voltage between the gate and the source of the first p-type transistor 114 and the second p-type transistor 116 varying through time. Graph 416 shows the current through the first p-type transistor 114 and the second p-type transistor 116 varying through time. Graph 418 shows the gate voltage of the first n-type transistor 118 and the second n-type transistor 120 varying through time. Graph 420 shows the voltage between the gate and the source of the first n-type transistor 118 and the second n-type transistor 120 varying through time. Graph 422 shows the current through the first n-type transistor 118 and the second n-type transistor 120 varying through time.

Graph 402 shows the voltage at the second switch terminal 104 is high during a first time t1, the voltage at the second switch terminal 104 is driven by the voltage at the first switch terminal 102 during a second time t2, and the voltage at the second switch terminal 104 is low during a third time t3.

Graph 404 shows the voltage at the first switch terminal 102 is driven to be in a sawtooth waveform. This waveform has been selected for illustrative purposes.

Graph 408 shows the current through the second switch terminal 104 and the first switch terminal 102. This current starts on the rising edge of the control pulse and this current ends on the falling edge of the control pulse. During the time that current is flowing, there is a sawtooth waveform for illustrative purposes. This current is composed of the current going through the first p-type transistor 114 and the second p-type transistor 116, and the current going through the first n-type transistor 118 and the second n-type transistor 120.

Graph 410 shows a control pulse being applied to the control terminal 106 start as low, switch to high at the end of the first time t1, and then go low at the third time t3.

During the first time, t1, at 424 the control pulse is low, indicative of an OFF state for the switch. So, the control circuit provides a high voltage at 426 to cause the first p-type transistor 114 and the second p-type transistor 116 to be nonconductive. This control pulse at 424 also causes the control circuit to provide a low voltage at 428 to cause the first n-type transistor 118 and the second n-type transistor to be nonconductive. Thus, even when VS and VD vary during the first time t1, no current flows between the first terminal and second terminal (see 427).

During the second time, t2, at 430 the control signal is high, indicative of an ON state for the switch. So, at 432 the control circuit provides the voltage VSS1 to the gate of the first p-type transistor 114 and the second p-type transistor 116, and at 438 the control circuit provides the voltage VCC1 to the gate of the first n-type transistor 118 and the second n-type transistor 120. Thus, the voltage between the gate and the source of the first p-type transistor 114 and the second p-type transistor goes below the p-type transistor voltage threshold at 434. This causes the first p-type transistor 114 and the second p-type transistor to conduct current as shown at 436.

Additionally, the voltage between the gate and the source of the first n-type transistor 118 and the second n-type transistor 120 goes above the n-type transistor voltage threshold at 440. This causes the first n-type transistor 118 and the second n-type transistor 120 to conduct current as shown at 442. The time in which the first p-type transistor 114 and the second p-type transistor 116 conducts overlaps with the first n-type transistor 118 and the second n-type transistor 120 at 414*a* and 414*b*. This overlap shown at 414*a* and 414*b* ensures that while the voltage at the 402 and 404 changes, there is no drop in conductivity.

During the third time, t3, the control signal is low at 444. This low control signal causes the control circuit to output a high voltage at 446 to the gates of the first p-type transistor 114 and the second p-type transistor 116, and output a low voltage at 448 to the gates of the first n-type transistor 118 and the second n-type transistor 120.

Figure 5:
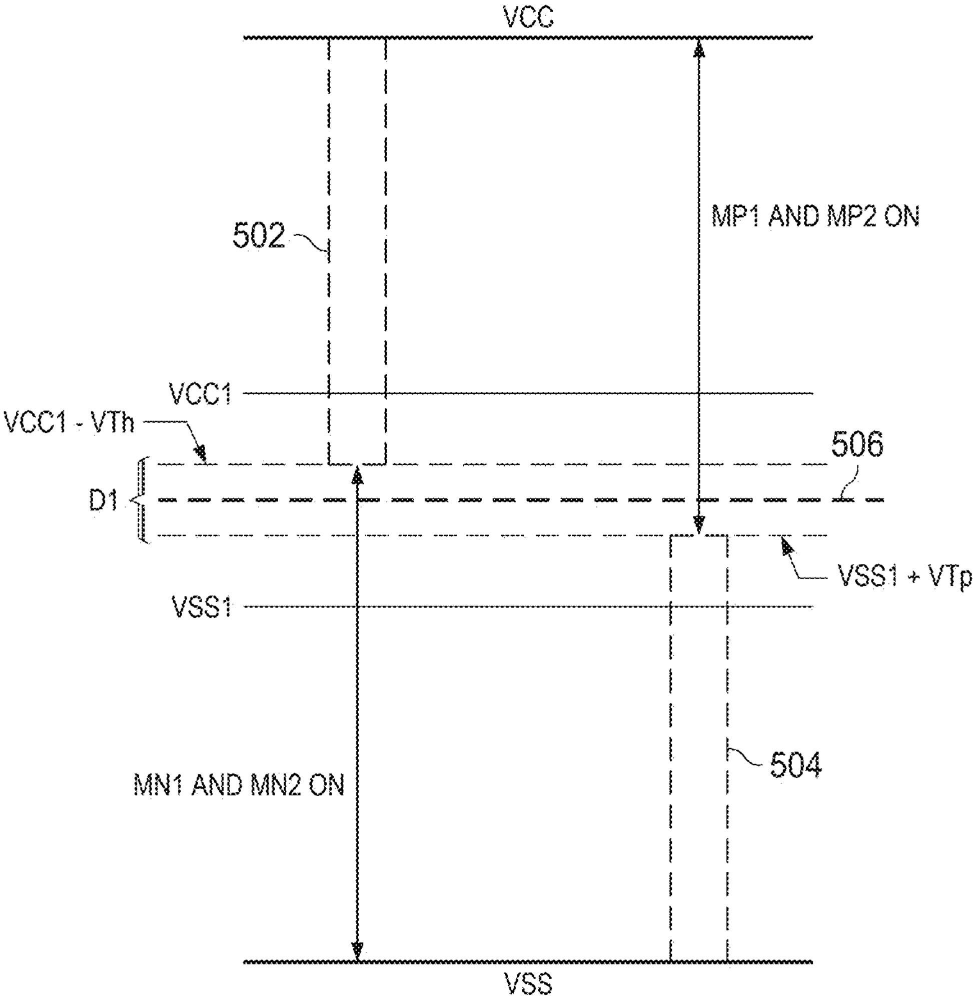
FIG. 5 shows a voltage diagram indicating how the switch can conduct through different input voltages according to an embodiment of the invention.

FIG. 5 shows a voltage diagram that explains the ON relationship of this circuit 100. This figure shows a voltage range with values from lowest to highest being VSS, VSS1, VSS1+Vtp, the midpoint 506, VCC1−Vtn, VCC1, and VCC. A region of input voltages to the first switch terminal 102 and/or the second switch terminal 104 where the first n-type transistor 118 and the second n-type transistor 120 conduct is shown between VSS and VCC1-VTn. A region of input voltages to the first switch terminal 102 and/or the second switch terminal 104 where the first p-type transistor 114 and the second p-type transistor 116 conduct is shown between VCC and VSS1-VTp. The distance, d1, shows an amount of overlap between the ON state of the n-type transistors and the p-type transistors. The value for d1 is related to $\delta 1$ and $\delta 2$, such that d1 may be in the range of −10V to 10V such as, for example, −100 mV to 100 mV, or 0V to 100 mV. Region 502 is a region that that n-type transistor ON can extend into, and region 504 is a region that the p-type transistor ON can extend into. Thus, the distance d1 can increase, leading to more overlap in the transistors ON state.

Figure 6:
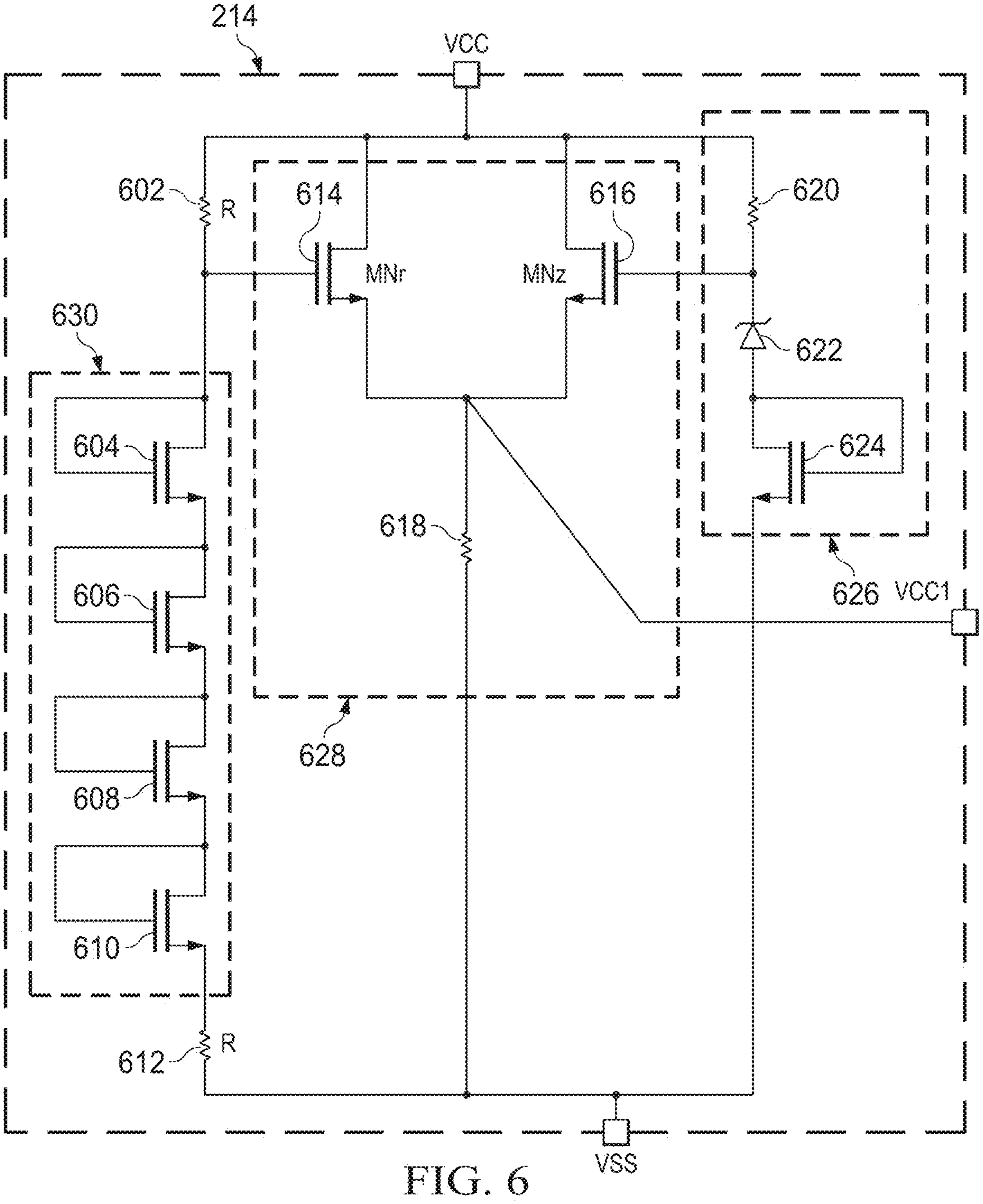
FIG. 6 shows an example circuit for a voltage supply generator.

FIG. 6 shows an example circuit for the second voltage supply generator 214. This example has a first resistor 602, a plurality of diode-connected n-type transistors 630 in series, and a second resistor 612. The second voltage supply generator 214 further has a selector circuit 628 that has a fifth n-type transistor 614, a sixth n-type transistor 616, and a third resistor 618. The second voltage supply generator 214 also has a reference voltage generator 626 that has a fourth resistor 620, a Zener diode 622, and a seventh n-type transistor 624. The plurality of diode-connected n-type transistors 630 has a first n-type transistor 604, a second n-type transistor 606, a third n-type transistor 608, and a fourth n-type transistor 610.

The first n-type transistor 604, the second n-type transistor 606, the third n-type transistor 608, and the fourth n-type transistor 610 are arranged to be in a diode connected configuration and connected in series with each other. Thus, the first n-type transistor 604, the second n-type transistor 606, the third n-type transistor 608, and the fourth n-type transistor 610 are two terminal devices because of the diode connected configuration. The first resistor 602, the first n-type transistor 604, the second n-type transistor 606, the third n-type transistor 608, the fourth n-type transistor 610 and the second resistor 612 form a first series connection from VCC to VSS.

The seventh n-type transistor 624 is also in a diode connected configuration. The fourth resistor 620, the Zener diode 622, and the seventh n-type transistor 624 form a second series connection from VCC to VSS. The anode of the Zener diode 622 is connected to the seventh n-type transistor 624, and the cathode of the Zener diode 622 is connected to the fourth resistor 620.

The fifth n-type transistor 614 has a gate terminal connected between the first resistor 602 and the first n-type transistor 604, and the fifth n-type transistor 614 has a drain terminal connected to VCC, and a source terminal connected to VCC1. The sixth n-type transistor 616 has a gate terminal connected between the fourth resistor 620 and the Zener diode 622, and the sixth n-type transistor 616 has a drain terminal connected to VCC, and a source terminal connected to VCC1. The third resistor 618 is connected between VCC1 and VSS.

The operation of the second voltage supply generator 214 shown in FIG. 6 is now described. At voltages of VCC sufficient to turn on the n-type transistors in the first series connection, the first series connection generates a voltage to the gate of the fifth n-type transistor 614 that is half the voltage between VCC and VSS plus two times the voltage threshold of the n-type transistors plus two times the non-ideal voltage characteristic of the n-type transistors (81).

$$\frac{VCC - VSS}{2} + 2 * V_{Tn} + 2 * \delta 1$$

It has been appreciated that the voltage threshold of the first n-type transistor 118 and the second n-type transistor 120 is substantially equal to the voltage threshold of the n-type transistors in the first voltage generator.

The fifth n-type transistor 614 along with the third resistor 618 is in a source follower configuration, so that the voltage at the source of the fifth n-type transistor 614 is a buffered version of approximately the voltage at the gate minus the voltage threshold of the fifth n-type transistor 614 and minus the non-ideal voltage drop characteristic of the n-type transistors. Because all the n-type transistors have the same voltage threshold, the value at VCC1, due to the fifth n-type transistor 614, is approximately half the voltage between VCC and VSS plus VTn plus δ1.

$$VCC1 = \frac{VCC - VSS}{2} + V_{Tn} + \delta 1$$

Alternatively, at voltages of VCC insufficient to turn on the n-type transistors in the first series connection, the second series connection generates a voltage for a gate of the sixth n-type transistor 616 that is equal to the Zener voltage plus the n-type transistor threshold voltage plus the non-ideal voltage drop characteristic of the n-type transistors.

$$V_Z + V_{Tn} + \delta 1$$

The sixth n-type transistor 616 is also in a source follower configuration, so a voltage drop equal to VTn+δ1 occurs. Thus, the Zener voltage is applied to VCC1.

$$VCC1 = V_Z$$

Therefore, at low voltage values for VCC, a minimum voltage, $V_Z$, is provided to VCC1, and at high voltage values for VCC, a voltage value that is equal to the midpoint plus the n-type transistor threshold value is provided to VCC1.

Figure 7:
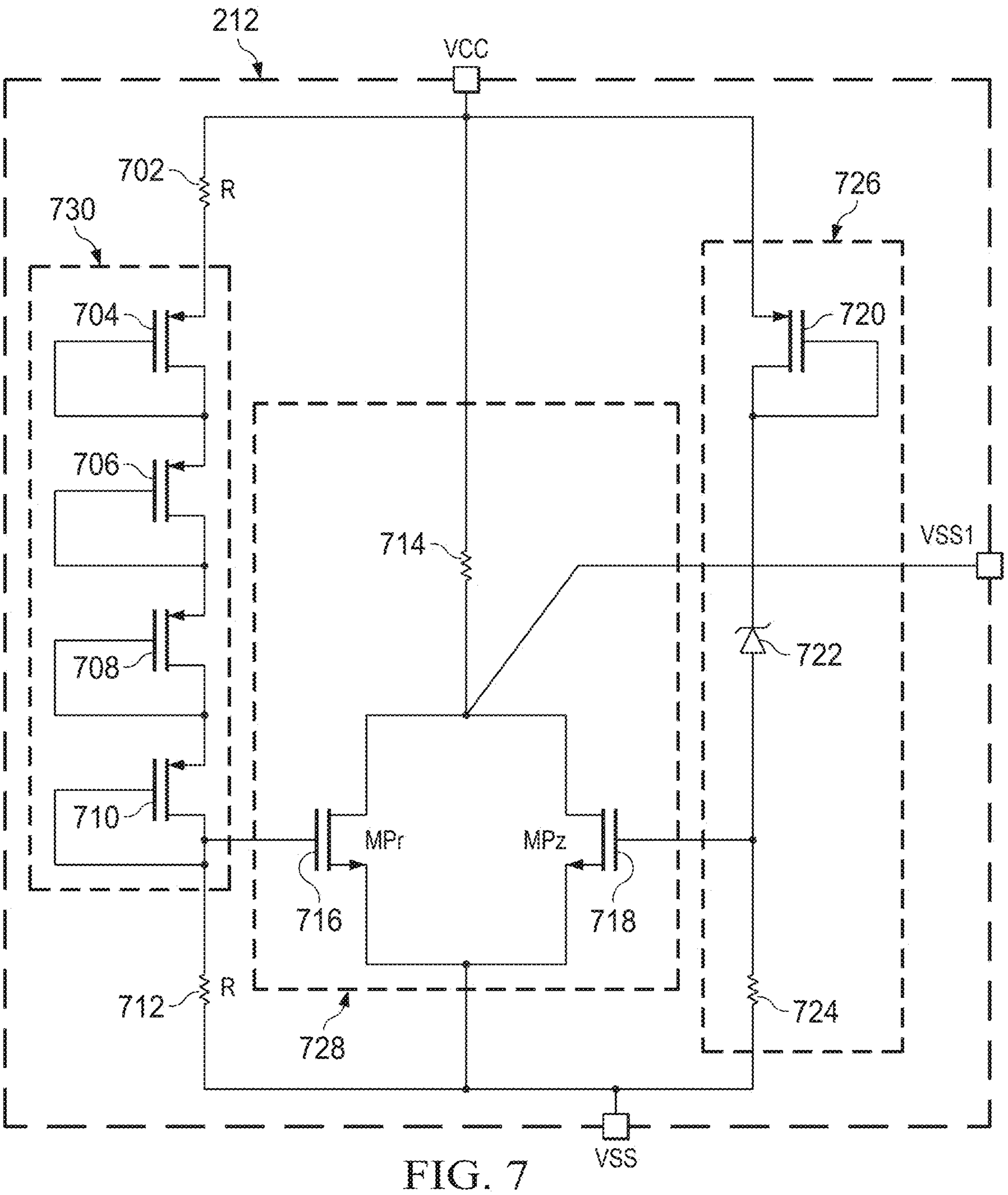
FIG. 7 shows an example circuit for another voltage supply generator.

FIG. 7 shows an example circuit for the first voltage supply generator 212. This example has a first resistor 702, a plurality of diode-connected p-type transistors 730 in series, and a second resistor 712. The first voltage supply generator 212 further has a selector circuit 728 that has a third resistor 714, a fifth p-type transistor 716, and a sixth p-type transistor 718. The first voltage supply generator 212 also has a reference voltage generator 726 which has a seventh p-type transistor 720, a Zener diode 722, and a fourth resistor 724. The plurality of diode-connected p-type transistors 730 has a first p-type transistor 704, a second p-type transistor 706, a third p-type transistor 708, and a fourth p-type transistor 710.

The first p-type transistor 704, the second p-type transistor 706, the third p-type transistor 708, the fourth p-type transistor 710, and the seventh p-type transistor 720 are arranged to be in a diode connected configuration, and are each two terminal devices. The first resistor 702, the first p-type transistor 704, the second p-type transistor 706, the third p-type transistor 708, the fourth p-type transistor 710, and the second resistor 712 are form a first series connection from VCC to VSS. The seventh p-type transistor 720, the Zener diode 722, and the fourth resistor 724 form a second series connection from VCC to VSS.

The fifth p-type transistor 716 has a gate terminal connected between the fourth p-type transistor 710 and the second resistor 712, a source terminal connected to VSS1, and a drain terminal connected to VSS. The sixth p-type transistor 718 has a gate terminal connected between the Zener diode 722 and the fourth resistor 724, a source terminal connected to VSS1, and a drain terminal connected to VSS. The third resistor 714 is connected between VCC and VSS1.

The operation of the first voltage supply generator 212 is similar to the operation of the second voltage supply generator 214. The first series connection in the second voltage supply generator 214 provides a voltage equal to half the voltage between VCC and VSS minus two times the voltage threshold of the p-type transistors minus two times the non-ideal voltage characteristic of the p-type transistors (82) at voltages off VCC sufficient to turn on the p-type transistors.

$$\frac{VCC - VSS}{2} - 2 * V_{Tp} - 2 * \delta 2$$

It has been appreciated that the voltage threshold of the first p-type transistor 114 and the second p-type transistor 116 is substantially equal to the voltage threshold of the p-type transistors in the second voltage generator.

The fifth p-type transistor 716 along with the third resistor 714 form a source follower configuration, so that the voltage at the source of the fifth p-type transistor 716 is a buffered version of approximately the voltage at the gate plus the voltage threshold of the fifth p-type transistor 716 and plus the non-ideal voltage characteristic of the p-type transistors. Because all the p-type transistors have the same voltage threshold, the value as VSS1, due to the fifth p-type transistor 716, is approximately half the voltage between VCC and VSS minus VTp minus δ2.

$$VSS1 = \frac{VCC - VSS}{2} - V_{Tp} - \delta 2$$

Alternatively, at voltages of VCC insufficient to turn on the p-type transistors in the first series connection, the second series connection generates a voltage for a gate of the sixth p-type transistor 718 that is equal to VCC minus the voltage drop across the Zener diode 722 minus the voltage drop across the seventh p-type transistor 720.

$$VCC - V_Z - V_{Tp} - \delta 2$$

The sixth p-type transistor 718 is also in a source follower configuration, so a voltage gain equal to VTp+δ2 is provided. Thus, the sixth p-type transistor 718 drives VSS1 to $VCC-V_Z$.

It has been appreciated that δ1 may be within a first range. The first range may be between −1V to 1V such as, for example, 0V to 100 mV or −100 mV to 100 mV. The second range for δ2 may be between −1V to 1V such as, for example, 0V to 100 mV or −100 mV to 100 mV.

Figure 8:
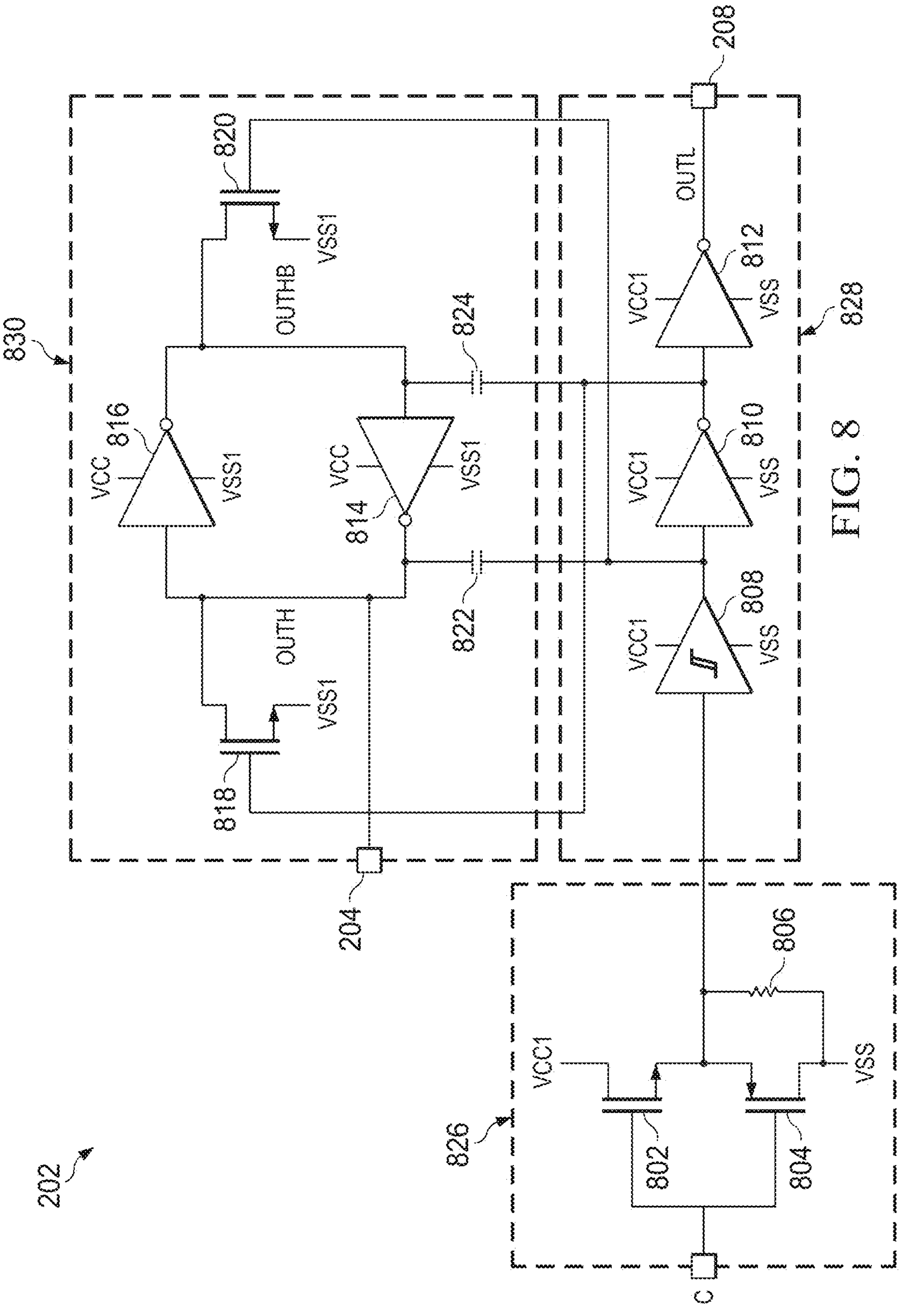
FIG. 8 shows an example circuit for a level shifter.

FIG. 8 shows an example implementation of the level shifter 202. This level shifter 202 has a switching circuit 826, a buffering circuit 828, and a shifting circuit 830. The switching circuit 826 is connected to the buffering circuit 828, and the buffering circuit 828 is connected to the shifting circuit 830.

The switching circuit 826 has a first CMOS transistor 802 with a drain terminal connected to VCC1, and a source terminal connected to a source terminal of a second CMOS transistor 804. The first CMOS transistor 802 and the second CMOS transistor 804 share a gate connection that is connected to the control terminal. The switching circuit 826 also has a pull down resistor 806 connected between the source terminal of the first CMOS transistor 802 and VSS. The output of the switching circuit 826, which is the interconnection between the source terminal of the first CMOS transistor 802, the source terminal of the second CMOS transistor 804, and the pull down resistor 806 is an output. The output of the switching circuit 826 is provided to an input of the buffering circuit 828.

The input to the buffering circuit 828 is connected to a Schmitt Trigger 808, the output of the Schmitt Trigger 808 is connected to a first inverter 810 and connected to a first input of the shifting circuit 830. The first inverter 810 has an output connected to an input of a second inverter 812 and connected to a second input of the shifting circuit 830. The second inverter 812 has an output connected to the first output 208. The Schmitt Trigger 808, the first inverter 810, and the second inverter 812 are all connected between rails VSS and VCC1.

The shifting circuit 830 has a first common source transistor 818, a second common source transistor 820, a first capacitor 822, a second capacitor 824, a first high-rail inverter 814, and a second high-rail inverter 816. The first input of the shifting circuit 830 is connected to the gate of the second common source transistor 820 and to the first capacitor 822. The second input of the shifting circuit 830 is connected to the gate of the first common source transistor 818 and to the second capacitor 824. The first high-rail inverter 814 has an output connected to the input of the second high-rail inverter 816, and the output of the second high-rail inverter 816 is connected to the input of the first high-rail inverter 814. The first capacitor 822 is connected to the output of the first high-rail inverter 814 and connected to a drain terminal of the first common source transistor 818. The second capacitor 824 is connected to the output of the second high-rail inverter 816 and is connected to a drain terminal of the second common source transistor 820. The first common source transistor 818 and the second common source transistor 820 both have source terminal connected to VSS1. The first high-rail inverter 814 and the second high-rail inverter 816 are both connected between rails VCC and VSS1.

When the switching circuit 826 receives a control signal that switches low to high, the first CMOS transistor 802 turns on and provides a high voltage to the buffering circuit 828. When the switching circuit 826 receives a control signal that switches from high to low, the combination of the second CMOS transistor 804 and the pull down resistor 806 provides a low voltage to the buffering circuit 828. Thus, the switching circuit 826 propagates the switch from the control terminal.

When the buffering circuit 828 receives an input that switches from low to high, the Schmitt Trigger 808 outputs a high voltage, the first inverter 810 outputs a low voltage, and the second inverter 812 outputs a high voltage. The high voltage outputted by the second inverter 812 is VCC1, which is its rail, and VCC1 turns on the first n-type transistor 118 and the second n-type transistor 120. When the buffering circuit 828 receives an input that switches from high to low, the Schmitt Trigger 808 outputs a low voltage, the first inverter 810 outputs a high voltage, and the second inverter 812 outputs a low voltage. Thus, when the input is high, the first n-type transistor 118 and the second n-type transistor 120 are off.

Due to the nature of the first high-rail inverter 814 being connected to the second high-rail inverter 816, a stable state is stored. When the shifting circuit 830 receives first input and second input that switch, the combination of the capacitive coupling through the first capacitor 822 and the second capacitor 824, along with the first common source transistor 818 and the second common source transistor 820 cause a current draw from the first high-rail inverter 814 and the second high-rail inverter 816 that switches the stable state. This switched state controls the on and off characteristics of the first p-type transistor 114 and the second p-type transistor 116 through the second output 204.

The methods are illustrated and described above as a series of acts or events, but the illustrated ordering of such acts or events is not limiting. For example, some acts or events may occur in different orders and/or concurrently with other acts or events apart from those illustrated and/or described herein. Also, some illustrated acts or events are optional to implement one or more aspects or embodiments of this description. Further, one or more of the acts or events depicted herein may be performed in one or more separate acts and/or phases. In some embodiments, the methods described above may be implemented in a computer readable medium using instructions stored in a memory.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first voltage" described in connection with a first figure may not necessarily correspond to a "first voltage" described in connection with another figure, and may not necessarily correspond to a "first voltage" in an un-illustrated embodiment.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are illustrated and/or described herein, other transistors (or equivalent switching devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other example, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero. Modifications are possible in the described examples, and other implementations are possible, within the scope of the claims.

What is claimed is:

1. A circuit comprising:

a first n-type transistor having a first terminal, a second terminal, and a control terminal, the first n-type transistor having a first threshold voltage;

a second n-type transistor having a first terminal, a second terminal, and a control terminal, the first terminal of the second n-type transistor coupled to the second terminal of the first n-type transistor, the control terminal of the second n-type transistor coupled to the control terminal of the first n-type transistor, the second n-type transistor having the first threshold voltage;

a first p-type transistor having a first terminal, a second terminal, and a control terminal, the first terminal of the first p-type transistor coupled to the first terminal of the first n-type transistor and the first p-type transistor having a second threshold voltage;

a second p-type transistor having a first terminal, a second terminal, and a control terminal, the first terminal of the second p-type transistor coupled to the second terminal of the first p-type transistor and the second terminal of the second p-type transistor coupled to the second terminal of the second n-type transistor, the control terminal of the second p-type transistor coupled to the control terminal of the first p-type transistor, the second p-type transistor having the second threshold voltage; and a control circuit coupled between a first voltage supply terminal and a second voltage supply terminal, the control circuit having a first output and a second output, the first output of the control circuit is coupled to the control terminal of the first n-type transistor and coupled to the control terminal of the second n-type transistor, the second output of the control circuit is coupled to the control terminal of the first p-type transistor and coupled to the control terminal of the second p-type transistor, the control circuit comprising:

a plurality of n-type transistors in series arranged in a diode-connected configuration;

a first resistor coupled between a first voltage supply terminal and a drain terminal of a first n-type transistor of the plurality of n-type transistors;

a second resistor coupled between a source terminal of a last n-type transistor of the plurality of n-type transistors and a second voltage supply terminal;

a third n-type transistor having a drain coupled to the first voltage supply terminal, a control terminal coupled between the first resistor and the plurality of n-type transistors, and a source terminal coupled to the first output of the control circuit; and a third resistor coupled between the source terminal of the third n-type transistor and the second voltage supply terminal.

2. The circuit of claim 1 comprising:

a fourth n-type transistor having a drain coupled to the first voltage supply terminal, and a source coupled to the first output of the control circuit; and a fourth resistor coupled between the first voltage supply terminal and a control terminal of the fourth n-type transistor.

3. The circuit of claim 2 comprising:

a Zener diode having an anode and a cathode, the cathode coupled to the control terminal of the fourth n-type transistor; and a fifth n-type transistor having a source, a drain, and a control terminal, the control terminal of the fifth n-type transistor coupled to the drain of the fifth n-type transistor and the anode of the Zener diode, the source of the fifth n-type transistor coupled to the second voltage supply terminal.

4. The circuit of claim 2 comprising:

a fifth n-type transistor having a source, a drain, and a control terminal, the control terminal of the fifth n-type transistor coupled to the drain of the fifth n-type transistor and to the control terminal of the fourth n-type transistor; and a Zener diode having an anode and a cathode, the cathode of the Zener diode coupled to the source of the fifth n-type transistor, and the anode of the Zener diode coupled to the second voltage supply terminal.

5. A circuit comprising:

a first n-type transistor having a first terminal, a second terminal, and a control terminal, the first n-type transistor having a first threshold voltage;

a second n-type transistor having a first terminal, a second terminal, and a control terminal, the first terminal of the second n-type transistor coupled to the second terminal of the first n-type transistor, the control terminal of the second n-type transistor coupled to the control terminal of the first n-type transistor, the second n-type transistor having the first threshold voltage;

a first p-type transistor having a first terminal, a second terminal, and a control terminal, the first terminal of the first p-type transistor coupled to the first terminal of the first n-type transistor and the first p-type transistor having a second threshold voltage;

a second p-type transistor having a first terminal, a second terminal, and a control terminal, the first terminal of the second p-type transistor coupled to the second terminal of the first p-type transistor and the second terminal of the second p-type transistor coupled to the second terminal of the second n-type transistor, the control terminal of the second p-type transistor coupled to the control terminal of the first p-type transistor, the second p-type transistor having the second threshold voltage; and a control circuit coupled between a first voltage supply terminal and a second voltage supply terminal, the control circuit having a first output and a second output, the first output of the control circuit is coupled to the control terminal of the first n-type transistor and coupled to the control terminal of the second n-type transistor, the second output of the control circuit is coupled to the control terminal of the first p-type transistor and coupled to the control terminal of the second p-type transistor, the control circuit comprising:

a plurality of p-type transistors in series arranged in a diode-connected configuration;

a first resistor coupled between a second voltage supply terminal and a drain terminal of a first p-type transistor of the plurality of p-type transistors;

a second resistor coupled between a source terminal of a last p-type transistor of the plurality of p-type transistors and a first voltage supply terminal;

a third p-type transistor having a drain coupled to the second voltage supply terminal, the third p-type transistor having a control terminal coupled between the first resistor and the plurality of p-type transistors, and the third p-type transistor having a source terminal coupled to second output of the control circuit; and a third resistor coupled between the source terminal of the third p-type transistor and the first voltage supply terminal.

6. The circuit of claim 5 comprising:

a fourth p-type transistor having a drain coupled to the second voltage supply terminal, and a source coupled to the second output of the control circuit; and a fourth resistor coupled between the second voltage supply terminal and a control terminal of the fourth p-type transistor.

7. The circuit of claim 6 comprising:

a Zener diode having an anode and a cathode, the anode coupled to the control terminal of the fourth p-type transistor; and a fifth p-type transistor having a source, a drain, and a control terminal, the control terminal of the fifth p-type transistor coupled to the drain of the fifth p-type transistor and the cathode of the Zener diode, the source of the fifth p-type transistor coupled to the first voltage supply terminal.

8. The circuit of claim 6 comprising:

a fifth p-type transistor having a source, a drain, and a control terminal, the control terminal of the fifth p-type transistor coupled to the drain of the fifth p-type transistor and to the control terminal of the fourth p-type transistor; and a Zener diode having an anode and a cathode, the cathode of the Zener diode coupled to the source of the fifth p-type transistor, and the anode of the Zener diode coupled to the second voltage supply terminal.

9. A circuit comprising:

a first n-type transistor having a first terminal, a second terminal, and a control terminal, the first n-type transistor having a first threshold voltage;

a second n-type transistor having a first terminal, a second terminal, and a control terminal, the first terminal of the second n-type transistor coupled to the second terminal of the first n-type transistor, the control terminal of the second n-type transistor coupled to the control terminal of the first n-type transistor, the second n-type transistor having the first threshold voltage;

a first p-type transistor having a first terminal, a second terminal, and a control terminal, the first terminal of the first p-type transistor coupled to the first terminal of the first n-type transistor and the first p-type transistor having a second threshold voltage;

a second p-type transistor having a first terminal, a second terminal, and a control terminal, the first terminal of the second p-type transistor coupled to the second terminal of the first p-type transistor and the second terminal of the second p-type transistor coupled to the second terminal of the second n-type transistor, the control terminal of the second p-type transistor coupled to the control terminal of the first p-type transistor, the second p-type transistor having the second threshold voltage; and a control circuit coupled between a first voltage supply terminal and a second voltage supply terminal, the control circuit having a first output and a second output, the first output of the control circuit is coupled to the control terminal of the first n-type transistor and coupled to the control terminal of the second n-type transistor, the second output of the control circuit is coupled to the control terminal of the first p-type transistor and coupled to the control terminal of the second p-type transistor, the control circuit comprising:

a fourth n-type transistor having a drain coupled to the first voltage supply terminal, the fourth n-type transistor having a source coupled to the first output of the control circuit; and third resistor coupled between the first output of the control circuit and the second voltage supply terminal; and a fourth resistor coupled between the first voltage supply terminal and a control terminal of the fourth n-type transistor.

10. The circuit of claim 9 comprising:

a Zener diode having an anode and a cathode, the cathode coupled to the control terminal of the fourth n-type transistor; and a fifth n-type transistor having a source, a drain, and a control terminal, the control terminal of the fifth n-type transistor coupled to the drain of the fifth n-type transistor and the anode of the Zener diode, the source of the fifth n-type transistor coupled to the second voltage supply terminal.

11. The circuit of claim 9 comprising:

a fifth n-type transistor having a source, a drain, and a control terminal, the control terminal of the fifth n-type transistor coupled to the drain of the fifth n-type transistor and to the control terminal of the fourth n-type transistor; and a Zener diode having an anode and a cathode, the cathode of the Zener diode coupled to the source of the fifth n-type transistor, and the anode of the Zener diode coupled to the second voltage supply terminal.

12. A circuit comprising:

a first n-type transistor having a first terminal, a second terminal, and a control terminal, the first n-type transistor having a first threshold voltage;

a second n-type transistor having a first terminal, a second terminal, and a control terminal, the first terminal of the second n-type transistor coupled to the second terminal of the first n-type transistor, the control terminal of the second n-type transistor coupled to the control terminal of the first n-type transistor, the second n-type transistor having the first threshold voltage;

a first p-type transistor having a first terminal, a second terminal, and a control terminal, the first terminal of the first p-type transistor coupled to the first terminal of the first n-type transistor and the first p-type transistor having a second threshold voltage;

a second p-type transistor having a first terminal, a second terminal, and a control terminal, the first terminal of the second p-type transistor coupled to the second terminal of the first p-type transistor and the second terminal of the second p-type transistor coupled to the second terminal of the second n-type transistor, the control terminal of the second p-type transistor coupled to the control terminal of the first p-type transistor, the second p-type transistor having the second threshold voltage; and a control circuit coupled between a first voltage supply terminal and a second voltage supply terminal, the control circuit having a first output and a second output, the first output of the control circuit is coupled to the control terminal of the first n-type transistor and coupled to the control terminal of the second n-type transistor, the second output of the control circuit is coupled to the control terminal of the first p-type transistor and coupled to the control terminal of the second p-type transistor, the control circuit comprising:

a fourth p-type transistor having a drain coupled to the second voltage supply terminal, the fourth p-type transistor having a source coupled to the second output of the control circuit; and a third resistor coupled between the first voltage supply terminal and the second output of the control circuit; and a fourth resistor coupled between the second voltage supply terminal and a control terminal of the fourth p-type transistor.

13. The circuit of claim 12 comprising:

a Zener diode having an anode and a cathode, the anode coupled to the control terminal of the fourth p-type transistor; and a fifth p-type transistor having a source, a drain, and a control terminal, the control terminal of the fifth p-type transistor coupled to the drain of the fifth p-type transistor and the cathode of the Zener diode, the source of the fifth p-type transistor coupled to the first voltage supply terminal.

14. The circuit of claim 12 comprising:

a fifth p-type transistor having a source, a drain, and a control terminal, the control terminal of the fifth p-type transistor coupled to the drain of the fifth p-type transistor and to the control terminal of the fourth p-type transistor; and a Zener diode having an anode and a cathode, the cathode of the Zener diode coupled to the source of the fifth p-type transistor, and the anode of the Zener diode coupled to the second voltage supply terminal.

15. A circuit comprising:

a first n-type transistor having a first terminal, a second terminal, and a control terminal, the first n-type transistor having a first threshold voltage;

a second n-type transistor having a first terminal, a second terminal, and a control terminal, the first terminal of the second n-type transistor coupled to the second terminal of the first n-type transistor, the control terminal of the second n-type transistor coupled to the control terminal of the first n-type transistor, the second n-type transistor having the first threshold voltage;

a first p-type transistor having a first terminal, a second terminal, and a control terminal, the first terminal of the first p-type transistor coupled to the first terminal of the first n-type transistor and the first p-type transistor having a second threshold voltage;

a second p-type transistor having a first terminal, a second terminal, and a control terminal, the first terminal of the second p-type transistor coupled to the second terminal of the first p-type transistor and the second terminal of the second p-type transistor coupled to the second terminal of the second n-type transistor, the control terminal of the second p-type transistor coupled to the control terminal of the first p-type transistor, the second p-type transistor having the second threshold voltage; and a control circuit coupled between a first voltage supply terminal and a second voltage supply terminal, the control circuit having a first output and a second output, the first output of the control circuit is coupled to the control terminal of the first n-type transistor and coupled to the control terminal of the second n-type transistor, the second output of the control circuit is coupled to the control terminal of the first p-type transistor and coupled to the control terminal of the second p-type transistor, the control circuit comprising:

a plurality of n-type transistors in series arranged in a first diode-connected configuration;

a first resistor coupled between a first voltage supply terminal and a drain terminal of a first n-type transistor of the plurality of n-type transistors;

a second resistor coupled between a source terminal of a last n-type transistor of the plurality of n-type transistors and a second voltage supply terminal;

a third n-type transistor having a drain coupled to the first voltage supply terminal, the third n-type transistor having a control terminal coupled between the first resistor and the plurality of n-type transistors, and the third n-type transistor having a source terminal coupled to the first output of the control circuit;

a third resistor coupled between the source terminal of the third n-type transistor and the second voltage supply terminal;

a fourth n-type transistor having a drain coupled to the first voltage supply terminal, the fourth n-type transistor having a source coupled to the first output of the control circuit; and a fourth resistor coupled between the first voltage supply terminal and a control terminal of the fourth n-type transistor;

a plurality of p-type transistors in series arranged in a second diode-connected configuration;

a fifth resistor coupled between a second voltage supply terminal and a drain terminal of a first p-type transistor of the plurality of p-type transistors;

a sixth resistor coupled between a source terminal of a last p-type transistor of the plurality of p-type transistors and a first voltage supply terminal;

a third p-type transistor having a drain coupled to the second voltage supply terminal, the third p-type transistor having a control terminal coupled between the first resistor and the plurality of p-type transistors, and the third p-type transistor having a source terminal coupled to second output of the control circuit;

a seventh resistor coupled between the first output of the control circuit and the second voltage supply terminal;

a fourth p-type transistor having a drain coupled to the second voltage supply terminal, the fourth p-type transistor having a source coupled to the second output of the control circuit; and a eighth resistor coupled between the second voltage supply terminal and a control terminal of the fourth p-type transistor.

16. The circuit of claim 15, comprising:

a first Zener diode having an anode and a cathode, the cathode coupled to the control terminal of the fourth n-type transistor;

a fifth n-type transistor having a source, a drain, and a control terminal, the control terminal of the fifth n-type transistor coupled to the drain of the fifth n-type transistor and the anode of the first Zener diode, the source of the fifth n-type transistor coupled to the second voltage supply terminal;

a second Zener diode having an anode and a cathode, the anode coupled to the control terminal of the fourth p-type transistor; and a fifth p-type transistor having a source, a drain, and a control terminal, the control terminal of the fifth p-type transistor coupled to the drain of the fifth p-type transistor and the cathode of the second Zener diode, the source of the fifth p-type transistor coupled to the first voltage supply terminal.

17. The circuit of claim 15, comprising:

a first Zener diode having an anode and a cathode, the cathode coupled to the control terminal of the fourth n-type transistor;

a fifth n-type transistor having a source, a drain, and a control terminal, the control terminal of the fifth n-type transistor coupled to the drain of the fifth n-type transistor and the anode of the first Zener diode, the source of the fifth n-type transistor coupled to the second voltage supply terminal;

a fifth p-type transistor having a source, a drain, and a control terminal, the control terminal of the fifth p-type transistor coupled to the drain of the fifth p-type transistor and to the control terminal of the fourth n-type transistor; and a second Zener diode having an anode and a cathode, the cathode coupled to the source of the fifth p-type transistor, and the anode of coupled to the second voltage supply terminal.

18. The circuit of claim 15, comprising:

a fifth n-type transistor having a source, a drain, and a control terminal, the control terminal of the fifth n-type transistor coupled to the drain of the fifth n-type transistor and to the control terminal of the fourth n-type transistor;

a first Zener diode having an anode and a cathode, the cathode coupled to the source of the fifth n-type transistor, and the anode coupled to the second voltage supply terminal;

a second Zener diode having an anode and a cathode, the anode coupled to the control terminal of the fourth p-type transistor; and a fifth p-type transistor having a source, a drain, and a control terminal, the control terminal of the fifth p-type transistor coupled to the drain of the fifth p-type transistor and the cathode of the second Zener diode, the source of the fifth p-type transistor coupled to the first voltage supply terminal.

19. The circuit of claim 15, comprising:

a fifth n-type transistor having a source, a drain, and a control terminal, the control terminal of the fifth n-type transistor coupled to the drain of the fifth n-type transistor and to the control terminal of the fourth n-type transistor;

a first Zener diode having an anode and a cathode, the cathode coupled to the source of the fifth n-type transistor, and the anode coupled to the second voltage supply terminal;

a fifth p-type transistor having a source, a drain, and a control terminal, the control terminal of the fifth p-type transistor coupled to the drain of the fifth p-type transistor and to the control terminal of the fourth n-type transistor; and a second Zener diode having an anode and a cathode, the cathode coupled to the source of the fifth p-type transistor, and the anode coupled to the second voltage supply terminal.

* * * * *